(12) United States Patent
Brazzle et al.

(10) Patent No.: US 11,272,618 B2
(45) Date of Patent: Mar. 8, 2022

(54) MECHANICALLY-COMPLIANT AND ELECTRICALLY AND THERMALLY CONDUCTIVE LEADFRAMES FOR COMPONENT-ON-PACKAGE CIRCUITS

(71) Applicant: ANALOG DEVICES INTERNATIONAL UNLIMITED COMPANY, Limerick, MA (US)

(72) Inventors: John David Brazzle, Tracy, CA (US); Frederick E. Beville, San Jose, CA (US); David A. Pruitt, San Jose, CA (US)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/095,276

(22) PCT Filed: Apr. 11, 2017

(86) PCT No.: PCT/US2017/027047
§ 371 (c)(1),
(2) Date: Oct. 19, 2018

(87) PCT Pub. No.: WO2017/189224
PCT Pub. Date: Nov. 2, 2017

(65) Prior Publication Data
US 2019/0141834 A1    May 9, 2019

Related U.S. Application Data

(60) Provisional application No. 62/327,875, filed on Apr. 26, 2016.

(51) Int. Cl.
*H05K 7/00* (2006.01)
*H05K 1/18* (2006.01)
(Continued)

(52) U.S. Cl.
CPC ........ *H05K 1/181* (2013.01); *H01L 23/49811* (2013.01); *H01L 23/50* (2013.01);
(Continued)

(58) Field of Classification Search
CPC . H01L 23/49811; H01L 23/50; H05K 1/0203; H05K 1/181; H05K 2201/1003;
(Continued)

(56) References Cited

U.S. PATENT DOCUMENTS 4,089,041 A    5/1978  Lockard
4,739,125 A *  4/1988  Watanabe ......... H01L 23/49555
                                                    174/528
(Continued)

FOREIGN PATENT DOCUMENTS

CN    101495014    7/2009
CN    104221145    12/2014
(Continued)

OTHER PUBLICATIONS

US 10,643,959 B2, 05/2020, Moussaouni et al. (withdrawn)
(Continued)

*Primary Examiner* — Pete T Lee
(74) *Attorney, Agent, or Firm* — Knobbe Martens Olson & Bear LLP

(57) ABSTRACT

A component-on-package circuit may include a component for an electrical circuit and a circuit module attached to the component. The circuit module may have circuitry and at least one leadframe which connects the circuitry to the component both electrically and thermally. The leadframe may have a high degree of both electrical and thermal conductivity and a non-planar shape that provides spring-like cushioning of force applied to the component in the direction of the circuit module.

16 Claims, 6 Drawing Sheets

(51) Int. Cl.
*H01L 23/498* (2006.01)
*H01L 23/50* (2006.01)
*H05K 1/02* (2006.01)
*H05K 3/28* (2006.01)
*H05K 3/34* (2006.01)

(52) U.S. Cl.
CPC ........... *H05K 1/0203* (2013.01); *H05K 3/284* (2013.01); *H05K 3/3426* (2013.01); *H05K 2201/1003* (2013.01); *H05K 2201/10515* (2013.01); *H05K 2201/10522* (2013.01); *H05K 2201/10553* (2013.01); *H05K 2201/10757* (2013.01); *H05K 2203/1316* (2013.01)

(58) Field of Classification Search
CPC .......... H05K 2201/10515; H05K 2201/10522; H05K 2201/10553; H05K 2201/10757; H05K 2203/1316; H05K 3/284; H05K 3/3426
See application file for complete search history.

(56) References Cited

U.S. PATENT DOCUMENTS

| | | | |
|---|---|---|---|
| 4,914,259 A | 4/1990 | Kobayashi et al. | |
| 5,343,075 A | 8/1994 | Nishino | |
| 5,485,037 A * | 1/1996 | Marrs | H01L 21/565 257/659 |
| 5,514,907 A | 5/1996 | Moshayedi | |
| 5,535,101 A | 7/1996 | Miles et al. | |
| 5,647,124 A * | 7/1997 | Chan | H05K 3/3426 29/840 |
| 5,706,172 A | 1/1998 | Lee | |
| 7,129,420 B2 | 10/2006 | Hashimoto | |
| 7,683,473 B2 | 3/2010 | Kasai et al. | |
| 7,838,334 B2 | 11/2010 | Yu et al. | |
| 7,982,139 B2 * | 7/2011 | Kariya | H05K 1/162 174/260 |
| 8,193,034 B2 | 6/2012 | Pagaila et al. | |
| 8,203,164 B2 | 6/2012 | Min et al. | |
| 8,241,956 B2 | 8/2012 | Camacho et al. | |
| 8,258,010 B2 | 9/2012 | Pagaila et al. | |
| 8,283,750 B2 | 10/2012 | Guiraud et al. | |
| 8,349,657 B2 | 1/2013 | Do et al. | |
| 8,349,721 B2 | 1/2013 | Shim et al. | |
| 8,383,457 B2 | 2/2013 | Pagaila et al. | |
| 8,409,922 B2 | 4/2013 | Camacho et al. | |
| 8,445,990 B2 | 5/2013 | Lin et al. | |
| 8,502,387 B2 | 8/2013 | Choi et al. | |
| 8,513,812 B2 | 8/2013 | Lin | |
| 8,525,340 B2 | 9/2013 | Eckhardt et al. | |
| 8,525,344 B2 | 9/2013 | Pagaila et al. | |
| 8,530,274 B2 | 9/2013 | Pagaila | |
| 8,563,418 B2 | 10/2013 | Pagaila et al. | |
| 8,569,882 B2 | 10/2013 | Ko et al. | |
| 8,581,381 B2 | 11/2013 | Zhao et al. | |
| 8,623,702 B2 | 1/2014 | Pagaila | |
| 8,624,374 B2 | 1/2014 | Ding et al. | |
| 8,674,516 B2 | 3/2014 | Han et al. | |
| 8,790,962 B2 | 7/2014 | Pagaila et al. | |
| 8,847,369 B2 | 9/2014 | Yew et al. | |
| 8,853,819 B2 | 10/2014 | Chen et al. | |
| 8,877,567 B2 | 11/2014 | Lee et al. | |
| 8,932,908 B2 | 1/2015 | Lee et al. | |
| 8,941,222 B2 | 1/2015 | Hunt | |
| 8,987,734 B2 | 3/2015 | Wang | |
| 9,006,099 B2 | 4/2015 | Anderson et al. | |
| 9,029,193 B2 | 5/2015 | Marimuthu et al. | |
| 9,054,083 B2 | 6/2015 | Suthiwongsunthorn et al. | |
| 9,059,186 B2 | 6/2015 | Shim et al. | |
| 9,082,780 B2 | 7/2015 | Lin et al. | |
| 9,105,532 B2 | 8/2015 | Choi et al. | |
| 9,117,812 B2 | 8/2015 | Lee et al. | |
| 9,129,980 B2 | 9/2015 | Khan et al. | |
| 9,142,515 B2 | 9/2015 | Pagaila et al. | |
| 9,171,792 B2 | 10/2015 | Sun et al. | |
| 9,177,832 B2 | 11/2015 | Camacho | |
| 9,236,332 B2 | 1/2016 | Pagaila et al. | |
| 9,236,352 B2 | 1/2016 | Pagaila et al. | |
| 9,240,331 B2 | 1/2016 | Kim et al. | |
| 9,245,834 B2 | 1/2016 | Hsieh | |
| 9,257,356 B2 | 2/2016 | Huang et al. | |
| 9,257,411 B2 | 2/2016 | Pagaila et al. | |
| 9,269,595 B2 | 2/2016 | Chi et al. | |
| 9,275,877 B2 | 3/2016 | Lin et al. | |
| 9,281,228 B2 | 3/2016 | Choi et al. | |
| 9,299,650 B1 | 3/2016 | Chi et al. | |
| 9,324,659 B2 | 4/2016 | Cho et al. | |
| 9,331,002 B2 | 5/2016 | Pagaila et al. | |
| 9,337,116 B2 | 5/2016 | Pagaila et al. | |
| 9,343,387 B2 | 5/2016 | Hsu et al. | |
| 9,373,578 B2 | 6/2016 | Choi et al. | |
| 9,378,983 B2 | 6/2016 | Choi et al. | |
| 9,379,064 B2 | 6/2016 | Oh et al. | |
| 9,390,945 B2 | 7/2016 | Lee et al. | |
| 9,391,046 B2 | 7/2016 | Park et al. | |
| 9,397,074 B1 | 7/2016 | Lee et al. | |
| 9,401,347 B2 | 7/2016 | Lee et al. | |
| 9,406,552 B2 | 8/2016 | Chen et al. | |
| 9,406,579 B2 | 8/2016 | Choi et al. | |
| 9,406,636 B2 | 8/2016 | Zhao et al. | |
| 9,406,658 B2 | 8/2016 | Lee et al. | |
| 9,478,486 B2 | 10/2016 | Kim et al. | |
| 9,484,259 B2 | 11/2016 | Lin et al. | |
| 9,502,335 B2 | 11/2016 | Lai et al. | |
| 9,508,626 B2 | 11/2016 | Pagaila et al. | |
| 9,559,043 B2 | 1/2017 | Ye | |
| 9,570,381 B2 | 2/2017 | Lu et al. | |
| 9,589,910 B2 | 3/2017 | Pagaila et al. | |
| 9,601,369 B2 | 3/2017 | Do et al. | |
| 9,613,912 B2 | 4/2017 | Scanlan | |
| 9,653,407 B2 | 5/2017 | Chen et al. | |
| 9,679,881 B2 | 6/2017 | Pagaila et al. | |
| 9,729,059 B1 | 8/2017 | Parto | |
| 9,754,868 B2 | 9/2017 | Chiang et al. | |
| 9,768,144 B2 | 9/2017 | Wu et al. | |
| 9,799,621 B2 | 10/2017 | Lee et al. | |
| 9,824,923 B2 | 11/2017 | Shariff et al. | |
| 9,842,808 B2 | 12/2017 | Shin et al. | |
| 9,847,324 B2 | 12/2017 | Lin et al. | |
| 9,922,917 B2 | 3/2018 | Yu et al. | |
| 9,922,955 B2 | 3/2018 | Camacho et al. | |
| 9,966,335 B2 | 5/2018 | Cho et al. | |
| 9,984,993 B2 | 5/2018 | Shu et al. | |
| 9,991,193 B2 | 6/2018 | Essig et al. | |
| 9,997,447 B1 | 6/2018 | Chen et al. | |
| 10,032,652 B2 | 7/2018 | Hsu et al. | |
| 10,096,578 B1 | 10/2018 | Yeh et al. | |
| 10,115,661 B2 | 10/2018 | Doyle et al. | |
| 10,115,701 B2 | 10/2018 | Zhao et al. | |
| 10,157,821 B1 | 12/2018 | Liu | |
| 10,157,887 B2 | 12/2018 | Chen et al. | |
| 10,157,890 B2 | 12/2018 | Yu et al. | |
| 10,163,867 B2 | 12/2018 | Kim et al. | |
| 10,163,876 B2 | 12/2018 | Jeng et al. | |
| 10,177,099 B2 | 1/2019 | Gerber et al. | |
| 10,186,467 B2 | 1/2019 | Appelt et al. | |
| 10,193,442 B2 | 1/2019 | Parto | |
| 10,199,320 B2 | 2/2019 | Chiang et al. | |
| 10,211,182 B2 | 2/2019 | Meyer et al. | |
| 10,224,301 B2 | 3/2019 | Fang et al. | |
| 10,229,859 B2 | 3/2019 | Wang | |
| 10,229,892 B2 | 3/2019 | Appelt | |
| 10,256,173 B2 | 4/2019 | Wu et al. | |
| 10,269,771 B2 | 4/2019 | Lyu et al. | |
| 10,276,382 B2 | 4/2019 | Hunt et al. | |
| 10,297,518 B2 | 5/2019 | Lin et al. | |
| 10,297,519 B2 | 5/2019 | Lin | |
| 10,325,868 B2 | 6/2019 | Tsai | |
| 10,332,862 B2 | 6/2019 | Chen et al. | |
| 10,361,150 B2 | 7/2019 | Chung et al. | |
| 10,381,300 B2 | 8/2019 | Kao et al. | |
| 10,388,598 B2 | 8/2019 | Lu et al. | |

(56) References Cited

U.S. PATENT DOCUMENTS

| | | |
|---|---|---|
| 10,403,609 B2 | 9/2019 | Geissler et al. |
| 10,410,970 B1 | 9/2019 | Chiu et al. |
| 10,418,314 B2 | 9/2019 | Lu |
| 10,446,411 B2 | 10/2019 | Chen et al. |
| 10,453,785 B2 | 10/2019 | Shim et al. |
| 10,453,802 B2 | 10/2019 | Hu |
| 10,497,635 B2 | 12/2019 | Brazzle et al. |
| 10,510,703 B2 | 12/2019 | Chi et al. |
| 10,510,720 B2 | 12/2019 | Lin et al. |
| 10,515,806 B2 | 12/2019 | Hunt et al. |
| 10,515,889 B2 | 12/2019 | Lu |
| 10,522,476 B2 | 12/2019 | Cheng et al. |
| 10,535,521 B2 | 1/2020 | Hunt et al. |
| 10,535,597 B2 | 1/2020 | Chen et al. |
| 10,548,249 B2 | 1/2020 | Mokler et al. |
| 10,553,487 B2 | 2/2020 | Zhao et al. |
| 10,573,624 B2 | 2/2020 | Chen et al. |
| 10,586,751 B2 | 3/2020 | Huang |
| 10,602,612 B1 | 3/2020 | Hoang et al. |
| 10,607,955 B2 | 3/2020 | Chiu et al. |
| 10,629,454 B2 | 4/2020 | Yeh |
| 10,629,531 B2 | 4/2020 | Lin |
| 10,636,756 B2 | 4/2020 | Yang et al. |
| 2004/0262774 A1 | 12/2004 | Kang et al. |
| 2005/0095835 A1 | 5/2005 | Humpston et al. |
| 2007/0114352 A1* | 5/2007 | Victor R. Cruz ..... H01L 21/561 248/316.7 |
| 2007/0222044 A1* | 9/2007 | Otremba ........... H01L 23/49562 257/678 |
| 2007/0246806 A1 | 10/2007 | Ong et al. |
| 2007/0262346 A1* | 11/2007 | Otremba ............... H01L 25/074 257/177 |
| 2007/0273049 A1 | 11/2007 | Khan et al. |
| 2008/0128890 A1 | 6/2008 | Choi et al. |
| 2010/0013064 A1 | 1/2010 | Hsu |
| 2010/0133674 A1 | 6/2010 | Hebert et al. |
| 2011/0013349 A1 | 1/2011 | Morikita et al. |
| 2011/0115060 A1 | 5/2011 | Chiu et al. |
| 2011/0177654 A1 | 7/2011 | Lee et al. |
| 2011/0241194 A1 | 10/2011 | Chen et al. |
| 2011/0266699 A1 | 11/2011 | Hilt et al. |
| 2011/0292632 A1* | 12/2011 | Wen ................... H01L 23/49562 361/820 |
| 2012/0025227 A1 | 2/2012 | Chan et al. |
| 2012/0074532 A1 | 3/2012 | Shih et al. |
| 2012/0139122 A1* | 6/2012 | Honjo ..................... H01L 25/16 257/773 |
| 2012/0181689 A1 | 7/2012 | Do et al. |
| 2012/0223428 A1 | 9/2012 | Pendse |
| 2012/0273960 A1 | 11/2012 | Park et al. |
| 2013/0015569 A1 | 1/2013 | Anderson et al. |
| 2013/0200527 A1 | 8/2013 | Yang et al. |
| 2013/0214399 A1 | 8/2013 | Joshi et al. |
| 2013/0234324 A1 | 9/2013 | Cho et al. |
| 2013/0249051 A1* | 9/2013 | Saye ................. H01L 23/49568 257/528 |
| 2013/0299971 A1 | 11/2013 | Do et al. |
| 2013/0341786 A1 | 12/2013 | Hsu et al. |
| 2014/0110860 A1 | 4/2014 | Choi et al. |
| 2014/0124919 A1 | 5/2014 | Huang et al. |
| 2014/0138807 A1 | 5/2014 | Gowda et al. |
| 2014/0145319 A1 | 5/2014 | Meinhold et al. |
| 2014/0151880 A1 | 6/2014 | Kao et al. |
| 2014/0154843 A1 | 6/2014 | Liu et al. |
| 2014/0159251 A1 | 6/2014 | Marimuthu et al. |
| 2014/0312503 A1 | 10/2014 | Seo |
| 2014/0361423 A1 | 12/2014 | Chi et al. |
| 2015/0061095 A1 | 3/2015 | Choi et al. |
| 2015/0084206 A1 | 3/2015 | Lin |
| 2015/0179570 A1 | 6/2015 | Marimuthu et al. |
| 2015/0179626 A1 | 6/2015 | Zhang et al. |
| 2015/0187710 A1 | 7/2015 | Scanlan et al. |
| 2015/0255360 A1 | 9/2015 | Hsu et al. |
| 2015/0279778 A1 | 10/2015 | Camacho et al. |
| 2015/0279815 A1 | 10/2015 | Do et al. |
| 2015/0325509 A1 | 11/2015 | We et al. |
| 2015/0325516 A1 | 11/2015 | Lin et al. |
| 2016/0035656 A1 | 2/2016 | Haba et al. |
| 2016/0066406 A1 | 3/2016 | Chen et al. |
| 2016/0071831 A1 | 3/2016 | Lee et al. |
| 2016/0126176 A1 | 5/2016 | Chang et al. |
| 2016/0150632 A1 | 5/2016 | Viswanathan et al. |
| 2016/0276256 A1 | 9/2016 | Chiang et al. |
| 2016/0284642 A1 | 9/2016 | Ganesan et al. |
| 2016/0307799 A1 | 10/2016 | Ho et al. |
| 2016/0322343 A1 | 11/2016 | Scanlan |
| 2016/0329272 A1 | 11/2016 | Geissler et al. |
| 2016/0343651 A1 | 11/2016 | Rae et al. |
| 2017/0011936 A1 | 1/2017 | Lin et al. |
| 2017/0062120 A1 | 3/2017 | Yun et al. |
| 2017/0077039 A1 | 3/2017 | Liao et al. |
| 2017/0077364 A1 | 3/2017 | Renn et al. |
| 2017/0098610 A1 | 4/2017 | Shim et al. |
| 2017/0110392 A1 | 4/2017 | Lin et al. |
| 2017/0148746 A1 | 5/2017 | Chiu et al. |
| 2017/0162476 A1 | 6/2017 | Meyer et al. |
| 2017/0179041 A1 | 6/2017 | Dias et al. |
| 2017/0179048 A1 | 6/2017 | Moussaoui et al. |
| 2017/0186702 A1 | 6/2017 | Liang et al. |
| 2017/0221858 A1 | 8/2017 | Yu et al. |
| 2017/0250172 A1 | 8/2017 | Huang et al. |
| 2017/0256481 A1 | 9/2017 | Chen et al. |
| 2017/0278807 A1 | 9/2017 | Chiu et al. |
| 2017/0311447 A1* | 10/2017 | Brazzle ................ H05K 1/0203 |
| 2018/0052281 A1 | 2/2018 | Kuo et al. |
| 2018/0061815 A1 | 3/2018 | Fang et al. |
| 2018/0068970 A1 | 3/2018 | Tanida et al. |
| 2018/0068983 A1 | 3/2018 | Chang et al. |
| 2018/0076165 A1 | 3/2018 | Aoki et al. |
| 2018/0090466 A1 | 3/2018 | Hung |
| 2018/0102325 A1 | 4/2018 | Yu et al. |
| 2018/0130774 A1 | 5/2018 | Lin et al. |
| 2018/0138113 A1 | 5/2018 | Chen et al. |
| 2018/0138131 A1 | 5/2018 | Kawabata |
| 2018/0151485 A1 | 5/2018 | Kao et al. |
| 2018/0158779 A1 | 6/2018 | Yang et al. |
| 2018/0182704 A1 | 6/2018 | Yeh |
| 2018/0261551 A1 | 9/2018 | Lee et al. |
| 2018/0269708 A1 | 9/2018 | Yeh |
| 2018/0297834 A1 | 10/2018 | Renaud-Bezot et al. |
| 2018/0331018 A1 | 11/2018 | Shim et al. |
| 2018/0331050 A1 | 11/2018 | Chung et al. |
| 2018/0337130 A1 | 11/2018 | Chang Chien et al. |
| 2018/0342484 A1 | 11/2018 | Chiu et al. |
| 2018/0350766 A1 | 12/2018 | Sato et al. |
| 2018/0374798 A1 | 12/2018 | Lee et al. |
| 2018/0374833 A1 | 12/2018 | Wong et al. |
| 2019/0013301 A1 | 1/2019 | Cheah et al. |
| 2019/0019763 A1 | 1/2019 | Chang et al. |
| 2019/0043819 A1 | 2/2019 | Ho et al. |
| 2019/0051590 A1 | 2/2019 | Fang et al. |
| 2019/0057940 A1 | 2/2019 | Cheah et al. |
| 2019/0115319 A1 | 4/2019 | Hiner et al. |
| 2019/0132983 A1 | 5/2019 | Weis et al. |
| 2019/0139846 A1 | 5/2019 | Lu |
| 2019/0139946 A1 | 5/2019 | Kim et al. |
| 2019/0148304 A1 | 5/2019 | Gavagnin et al. |
| 2019/0206799 A1 | 7/2019 | Keser et al. |
| 2019/0237374 A1 | 8/2019 | Huang et al. |
| 2019/0252305 A1 | 8/2019 | Peng et al. |
| 2019/0273044 A1 | 9/2019 | Fu et al. |
| 2019/0304807 A1 | 10/2019 | Baloglu et al. |
| 2019/0304936 A1 | 10/2019 | Shaul et al. |
| 2019/0319337 A1 | 10/2019 | Yen |
| 2019/0355654 A1 | 11/2019 | Xu et al. |
| 2019/0363423 A1 | 11/2019 | Lu et al. |
| 2019/0371621 A1 | 12/2019 | Darmawikarta et al. |
| 2019/0393140 A1 | 12/2019 | Yeh et al. |
| 2020/0006089 A1 | 1/2020 | Yu et al. |
| 2020/0006253 A1 | 1/2020 | Cheah et al. |

(56) References Cited

U.S. PATENT DOCUMENTS

| | | |
|---|---|---|
| 2020/0006295 A1 | 1/2020 | Yang et al. |
| 2020/0051927 A1 | 2/2020 | Lin et al. |
| 2020/0075490 A1 | 3/2020 | Sung et al. |
| 2020/0075562 A1 | 3/2020 | Yu et al. |
| 2020/0083591 A1 | 3/2020 | Hsieh et al. |
| 2020/0091059 A1 | 3/2020 | Lin et al. |
| 2020/0105653 A1 | 4/2020 | Elsherbini et al. |
| 2020/0111717 A1 | 4/2020 | Gmunder et al. |
| 2020/0111748 A1 | 4/2020 | Leitgeb |
| 2020/0120794 A1 | 4/2020 | Somada et al. |
| 2020/0126921 A1 | 4/2020 | Nair et al. |
| 2020/0144198 A1 | 5/2020 | Lee et al. |
| 2020/0152614 A1 | 5/2020 | Brazzle et al. |
| 2020/0185293 A1 | 6/2020 | Schmalzl et al. |
| 2020/0185330 A1 | 6/2020 | Yu et al. |
| 2020/0205279 A1 | 6/2020 | Ecton et al. |
| 2020/0211927 A1 | 7/2020 | Wan et al. |
| 2021/0111084 A1 | 4/2021 | Brazzle et al. |

FOREIGN PATENT DOCUMENTS

| | | |
|---|---|---|
| CN | 104934391 | 9/2015 |
| CN | 109075151 A | 12/2018 |
| CN | 110299329 | 10/2019 |
| CN | 110364491 | 10/2019 |
| CN | 111108598 | 5/2020 |
| CN | 111149201 | 5/2020 |
| EP | 0 384 927 A1 | 9/1990 |
| EP | 2381472 A1 | 10/2011 |
| EP | 3 217 774 A1 | 9/2017 |
| JP | S59-155154 | 9/1984 |
| KR | 20200010521 | 1/2020 |
| WO | WO 2010/067508 | 6/2010 |
| WO | WO-2017189224 A1 | 11/2017 |
| WO | WO 2019/066986 | 4/2019 |
| WO | WO 2019/066987 | 4/2019 |
| WO | WO 2019/132963 | 7/2019 |
| WO | WO 2019/132965 | 7/2019 |

OTHER PUBLICATIONS

"U.S. Appl. No. 15/495,405, Final Office Action dated Oct. 18, 2018", 17 pgs.
"U.S. Appl. No. 15/495,405, Non Final Office Action dated Apr. 5, 2018", 12 pgs.
"U.S. Appl. No. 15/495,405, Response filed Jun. 12, 2018 to Non Final Office Action dated Apr. 5, 2018", 8 pgs.
"International Application Serial No. PCT/US2017/027047, International Preliminary Report on Patentability dated Nov. 8, 2018", 8 pgs.
"Taiwanese Application Serial No. 106113400, Office Action dated Jul. 4, 2018", w/ Concise Statement of Relevance, 5 pgs.
"Taiwanese Application Serial No. 106113400, Response filed Jan. 9, 2019 to Office Action dated Jul. 4, 2018 ", w/ English Claims, 4 pgs.
"Taiwanese Application Serial No. 106113400, Office Action dated Jan. 16, 2019", w/ English Translation, 10 pgs.
"Taiwanese Application Serial No. 106113400, Response filed Apr. 3, 2019 to Office Action dated Jan. 16, 2019", w/ English claims, 16 pgs.
"Taiwanese Application Serial No. 106113400, Office Action dated Apr. 29, 2019", w/ English Translation, 4 pgs.
"European Application Serial No. 17719130.1, Response filed Jun. 3, 2019 to Communication Pursuant to Rules 161(1) and 162 EPC", w/ English Claims, 24 pgs.
"International Application Serial No. PCT/US2017/027047, International Search Report dated Jun. 29, 2017", 4 pgs.
"International Application Serial No. PCT/US2017/027047, Written Opinion dated Jun. 29, 2017", 4 pgs.
International Search Report and Written Opinion for International Application No. PCT/US2019/021908, 16 pages.
International Preliminary Report on Patentability for application No. PCT/US2019/021908, dated Sep. 29, 2020, in 9 pages.
Partial Search Report in European Application No. 21175552.5, dated Oct. 29, 2021, in 11 pages.
Office Action in Chinese Application No. 201780025431.5, dated Nov. 30, 2021.

\* cited by examiner

Electrical and thermal attachment

MECHANICALLY-COMPLIANT AND ELECTRICALLY AND THERMALLY CONDUCTIVE LEADFRAMES FOR COMPONENT-ON-PACKAGE CIRCUITS

CROSS-REFERENCE TO RELATED APPLICATION

This application is a U.S. National Stage Filing under 35 U.S.C. § 371 of International Patent Application No. PCT/US2017/027047, entitled "MECHANICALLY-COMPLIANT AND ELECTRONICALLY AND THERMALLY CONDUCTIVE LEADFRAMES FOR COMPONENT-ON-PACKAGE CIRCUITS," filed on Apr. 11. 2017, published on Nov. 2, 2017 as WO 2017/189224 A1, which is based upon and claims priority to U.S. provisional patent application 62/327,875, entitled "MECHANICALLY-COMPLIANT AND ELECTRONICALLY AND THERMALLY CONDUCTIVE LEADFRAMES FOR COMPONENT-ON-PACKAGE CIRCUITS," filed Apr. 26, 2016. The entire content of these applications are incorporated herein by reference.

BACKGROUND

Technical Field

This disclosure relates to high power density systems-in-packages (SIPs) or modules, packages that require low impedance, and packages with high thermal performance requirements. This disclosure also relates to module packages with high power/high current applications that require large externally mounted components and/or improved heat dissipation.

Description of Related Art

The desire for SIPs to have increased power and current capabilities, while at the same time minimizing their footprint within a system board design, can present a multitude of design constraints and limitations on the designer and module package engineer.

Higher power components may require a large amount of board space and may have a large thermal mass. Large inductors, for example, can be integrated into an SIP, but size limitations of the molded package may prevent the use of larger and more power-capable components. Due to their size, these large components may not be able to be enclosed within the SIP. They may also require attachments on the system board as near to the SIP as possible to minimize loss or noise in the circuit. For this reason, a package design and assembly methodology may need to integrate larger high power external active and passive components with the molded SIP, while maintaining minimal impact to real estate on the board.

Additionally, higher power packages and components may dissipate larger amounts of heat into their surroundings, primarily into the system board, distributing heat into adjacent packages and components. This may affect overall system efficiency and reliability. These high power packages may require high current pathways that may exceed the heat and current carrying capacity of package substrates and system boards, without the use of additional metal layers, solid metal vias, and costly heat sink apparatus. For this additional demand on the high power module package, a technology may be needed that provides a highly conductive thermal and electrical pathway within the SIP package body that is not dependent upon limitations of substrate and system board architectures.

SUMMARY

A component-on-package circuit may include a component for an electrical circuit and a circuit module attached to the component. The circuit module may have circuitry and at least one leadframe which connects the circuitry to the component both electrically and thermally. The leadframe may have a high degree of both electrical and thermal conductivity and a non-planar shape that provides spring-like cushioning of force applied to the component in the direction of the circuit module.

A method of making a component-on-package circuit may include attaching a component for an electrical circuit to a circuit module. The circuit module may have circuitry and at least one leadframe which connects the circuitry to the component after the attachment both electrically and thermally. The leadframe may have a high degree of both electrical and thermal conductivity and a non-planar shape that provides a spring-like cushioning of force applied to the component in the direction of the circuit module. The circuit module may be encapsulated in molding material after the circuit module has been attached to the component, without encapsulation the component at the same time.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION OF ILLUSTRATIVE EMBODIMENTS

Illustrative embodiments are now described. Other embodiments may be used in addition or instead. Details that may be apparent or unnecessary may be omitted to save space or for a more effective presentation. Some embodiments may be practiced with additional components or steps and/or without all of the components or steps that are described.

Disclosed is a package design and assembly methodology that may integrate mechanically compliant through-mold conductive leadframes for thermal and/or electrical interconnection of large high power externally attached active and passive components.

Active and/or passive components may be attached to the top of molded and/or unmolded SIPs and modules with full electrical functionality by use of internal leadframes embedded within the module package. These externally mounted components may combine with highly conductive leadframes to provide additional thermal pathways for dissipation of heat and may enhance thermal characteristics and improve power efficiency.

The highly conductive leadframes may be mechanically compliant and spring-like. Their spring-like action may absorb compressive forces placed on the externally mounted components in the direction of the module during or after assembly and/or may redirect these forces away from the substrate, internal components, and/or exposed component pads.

Electrical and/or thermal pathways may be provided by use of a mechanically compliant leadframe. The leadframe may extend from within the molded module substrate contact through the mold compound to make contact with internal components. The leadframe may extend through to the top of the module to form a contact pad for connection to top mounted active or passive components.

Figure 1A:
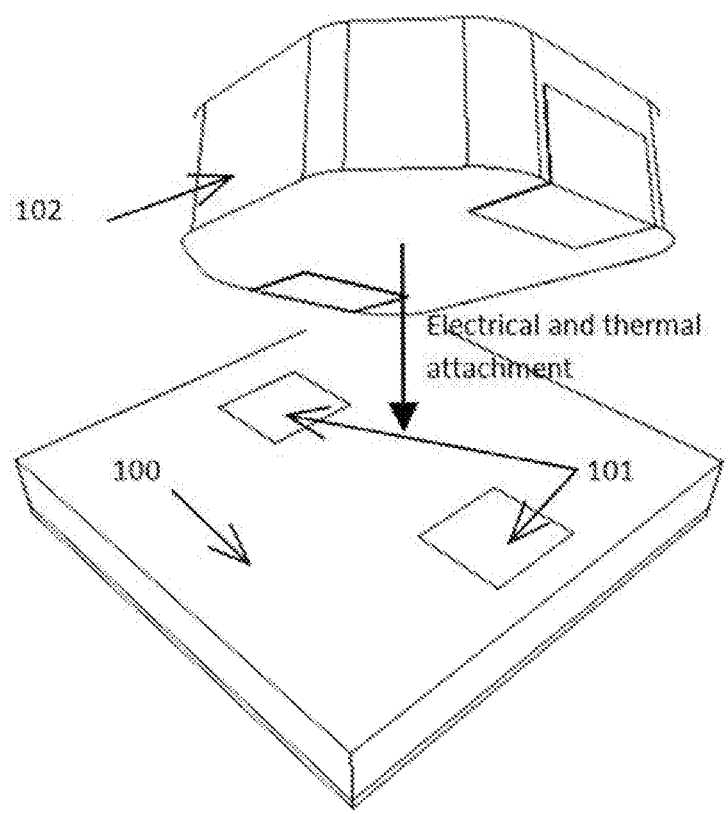
FIGS. 1A and 1B illustrate an external view of an example of a partially assembled (FIG. 1A) and fully assembled (FIG. 1B) components-on-package (CoP) device.
Figure 1B:
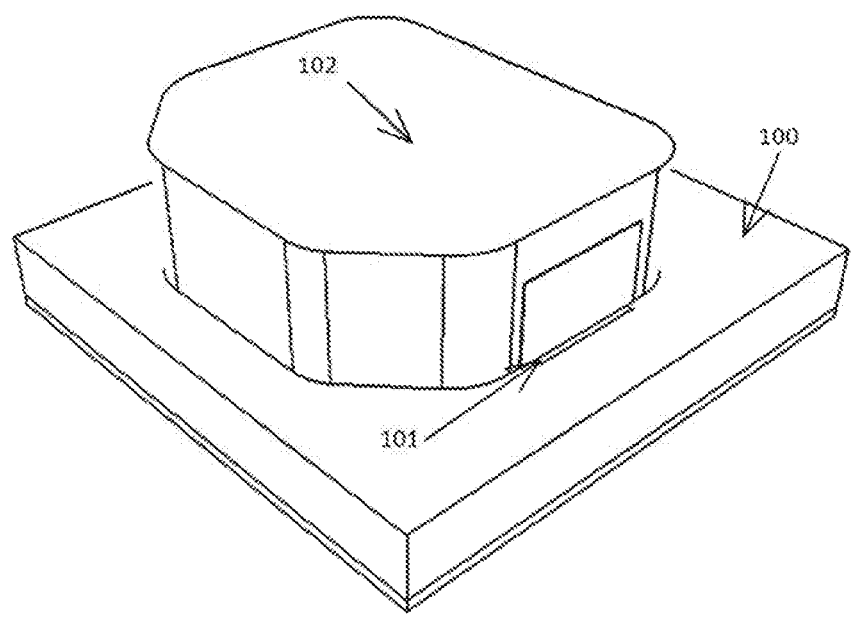

FIGS. 1A and 1B illustrate an external view of an example of a partially assembled (FIG. 1A) and fully assembled (FIG. 1B) components-on-package (CoP) device. A component 102 may be an inductor or other type of passive or active component or a set of components attached to a top of a CoP module package 100. The CoP module package 100 may be a fully molded electrical circuit and may be constructed with internal leadframes to form one or more exposed metal pads 101 for electrical and/or thermal connection to the externally mounted component 102. The component 102 may be electrically, thermally, and/or mechanically attached to the package.

The component 102 may have two contact terminals and may be electrically, thermally, and/or mechanically attached to the top of the module package. Electrical connection from the module to the component may be provided by an internal leadframe that may be embedded within the module package during a plastic molding process.

Figure 2:
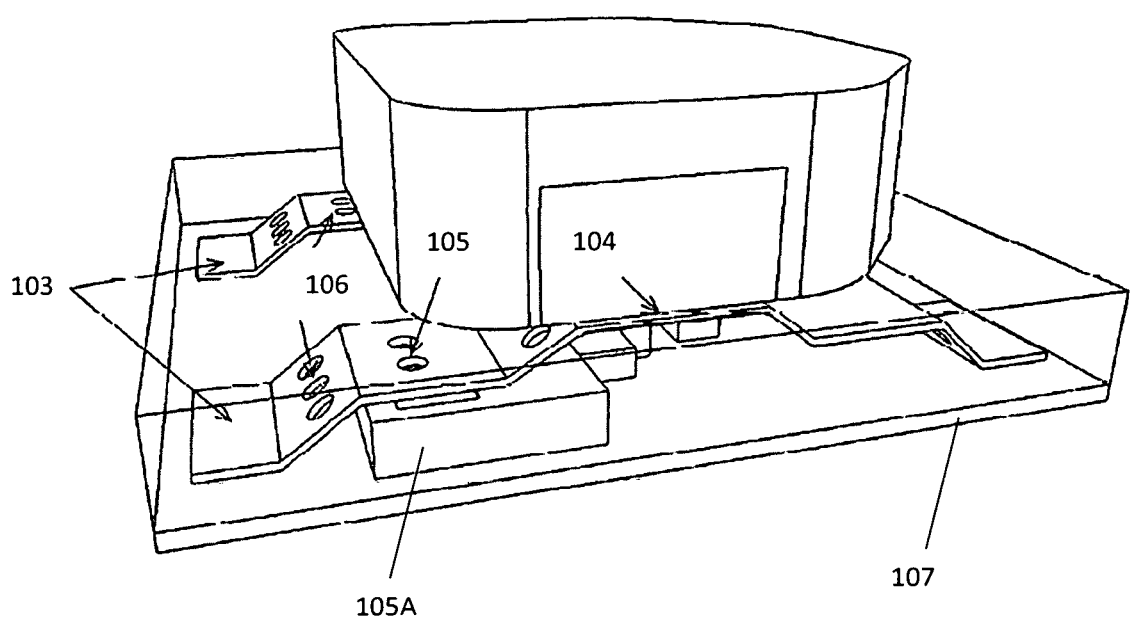
FIG. 2 illustrates internal construction details of an example of a CoP module package with internal leadframes forming electrical and/or thermal pathways for an externally attached component.

FIG. 2 illustrates internal construction details of an example of a CoP module package with internal leadframes 103 forming electrical and/or thermal pathways for an externally attached component 104. The example may be the same as the example shown in FIG. 1. The leadframes 103 may each be a mechanically compliant through-mold leadframe that completes the electrical circuit from a substrate 107 up to the component 104 and may provide additional thermal and electrical connections 105 for internal components 105A, such as a quad flat no-lead (QFN) package with exposed pad. One or more of the leadframes may also contain one or more openings 106 that may each be round, oval, rectangular, or any other shape. The openings 106 may improve plastic mold compound flow during the molding process and/or mold compound interlocking.

The internal leadframes 103 that are illustrated in FIG. 2 may each form a solderable contact region at the top surface of the module following the mold process. They may also each provide a high current electrical connection from the externally attached component 104 down through the mold compound to connect to the electrical circuit.

This leadframe electrical circuit connection may be soldered down to the module substrate 107 and may also be connected to multiple internal components 105A. This electrical pathway may provide a thermal pathway for heat to escape the module package.

The component 104 may be affixed to the top of the module by use of solder and/or epoxy attach materials using a post-mold SMT assembly process. Adhesive or other type of attaching material may be used to attach the body of the component to the plastic body of the module for additional mechanical stability.

The solder and epoxy materials used to attach the component may be electrically and/or thermally conductive to provide a high current (e.g., >50 amps) and a highly thermally conductive connection (e.g., >25 watts per meter per degree celsius) to the molded SIP. The attachment process and materials may combine to provide hold down strength and heat working characteristics sufficient to survive high temperature thermal cycling during operation and reliability testing.

The component 104 or multiple components may be passive and/or active. Their number may depend on the number of through mold connections provided by the leadframe design.

Figure 3A:
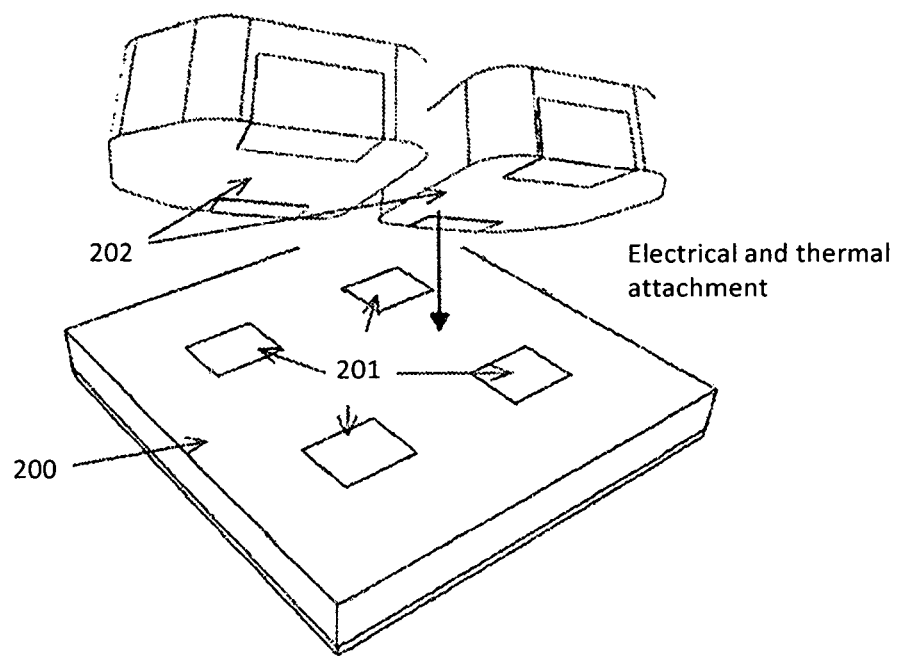
FIGS. 3A and 3B illustrate an external view of an example of a partially assembled (FIG. 3A) and fully assembled (FIG. 3B) multiple components-on-package (mCoP) device.
Figure 3B:
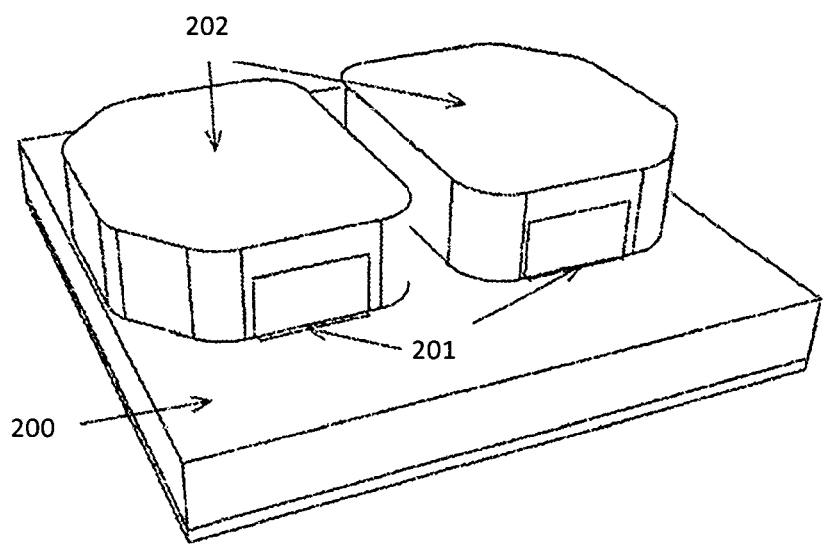
Figure 5:
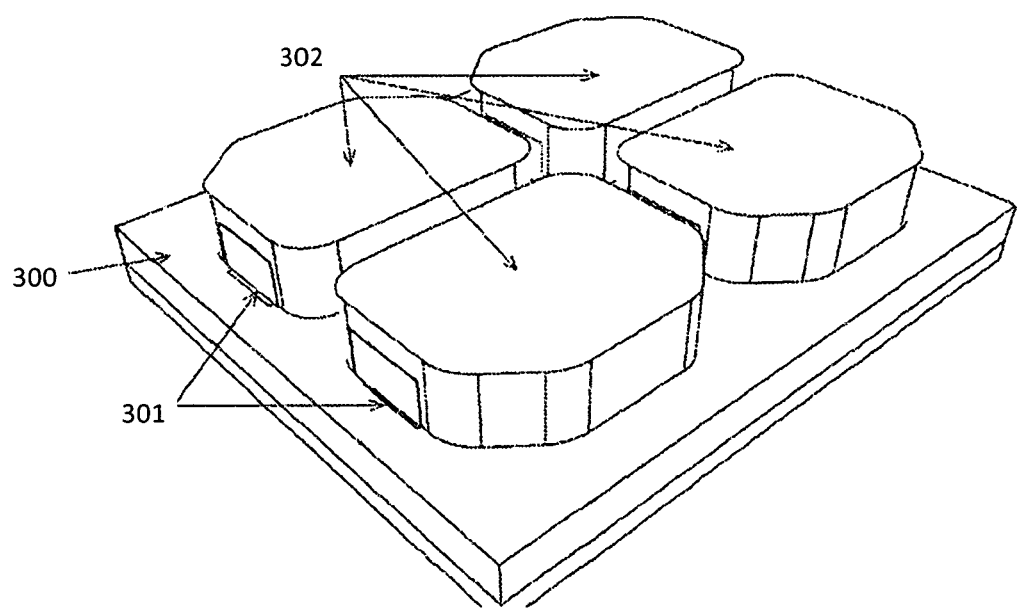
FIG. 5 illustrates an external view of another example of a multiple components-on-package (mCoP) device with four separate components that may be attached to the top of a mCoP module package.

FIGS. 3A and 3B and FIG. 5 show examples of multiple components-on-package (mCoP) devices that may include multiple passive components that are electrically and/or thermally attached to the top of the fully molded SIP or Module.

FIGS. 3A and 3B illustrate an external view of an example of a partially assembled (FIG. 3A) and fully assembled (FIG. 3B) multiple components-on-package (mCoP) device. Attached external components 202 may each be an inductor and/or other type of component or components which may be attached to the top of a mCoP module package 200. The mCoP module package 200 may be a full molded electrical circuit with internal leadframes that form one or more exposed pads 201 for electrical and/or thermal connection to the external components 202. The external components may be electrically, thermally, and/or mechanically attached to the module package 200.

Figure 4:
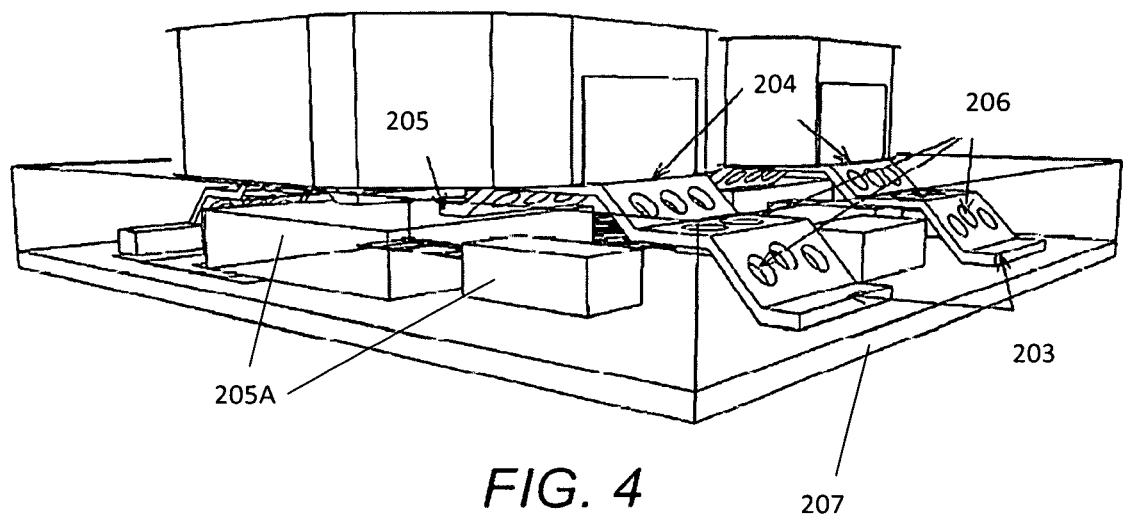
FIG. 4 illustrates internal construction details of another example of an mCoP module package that may have one or more internal leadframes that may form electrical and/or thermal pathways to one or more externally attached component connections.

FIG. 4 illustrates internal construction details of another example of an mCoP module package that may have one or more internal leadframes 203 that may form electrical and/or thermal pathways to one or more externally attached component connections 204. The example may be the same as the example shown in FIGS. 3A and 3B. One or more mechanically compliant through-mold leadframes 206 may complete the electrical circuit from the substrate 207 up to each of the component connections 204 and may provide additional thermal and/or electrical connections 205 to internal components 205A, such as to a QFN. The one or more of the leadframes 206 may also contain one or more openings 206 that may each be circular, oval, rectangular, or any other shape. The opening 206 may improve plastic mold compound flow during the molding process and/or improve mold compound interlocking.

FIG. 5 illustrates an external view of another example of a multiple components-on-package (mCoP) device with four separate components 302 that may be attached to the top of a mCoP module package 300. The mCoP Module package 300 may be a full molded electrical circuit with internal leadframes that form exposed pads 301 for electrical and/or thermal connection to all of the external components 302. All of the external components 302 may be electrically, thermally, and/or mechanically attached to the package through the leadframes. A different number of components may be used instead.

Figure 6:
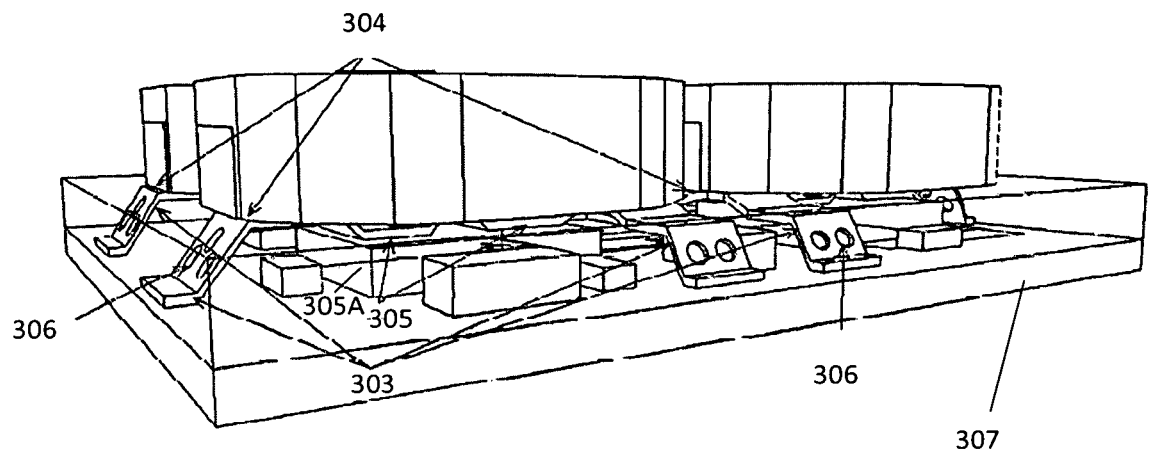
FIG. 6 illustrates internal construction details of another example of an mCoP module package with mechanically compliant internal leadframes that may form electrical and/or thermal pathways for externally attached component connections.

FIG. 6 illustrates internal construction details of another example of an mCoP module package with mechanically compliant internal leadframes 303 that may form electrical and/or thermal pathways for externally attached component connections 304. The example may be the same as the example shown in FIG. 5. The mechanically compliant through-mold leadframes may complete the electrical circuit from the substrate 307 up to the components and may provide additional thermal and/or electrical connections 305 for internal components 305A. One or more of the leadframes may also contain openings 306 that may be circular, oval, rectangular or any other shape. These openings 306 may improve plastic mold compound flow during the molding process and/or mold compound interlocking.

The leadframes employed (FIGS. 4 and 6) may provide electrical and/or thermal pathways for each attached component and may have openings that may assist in the assembly process by enhancing mold flow during the plastic molding process and/or providing additional mechanical stability by mold locking of the leadframe within the molded structure. The leadframe design may also provide for isolated and individual connection of all component leads for full functionality of each component, as required by the function of the electrical circuits within the module package.

Figure 7:
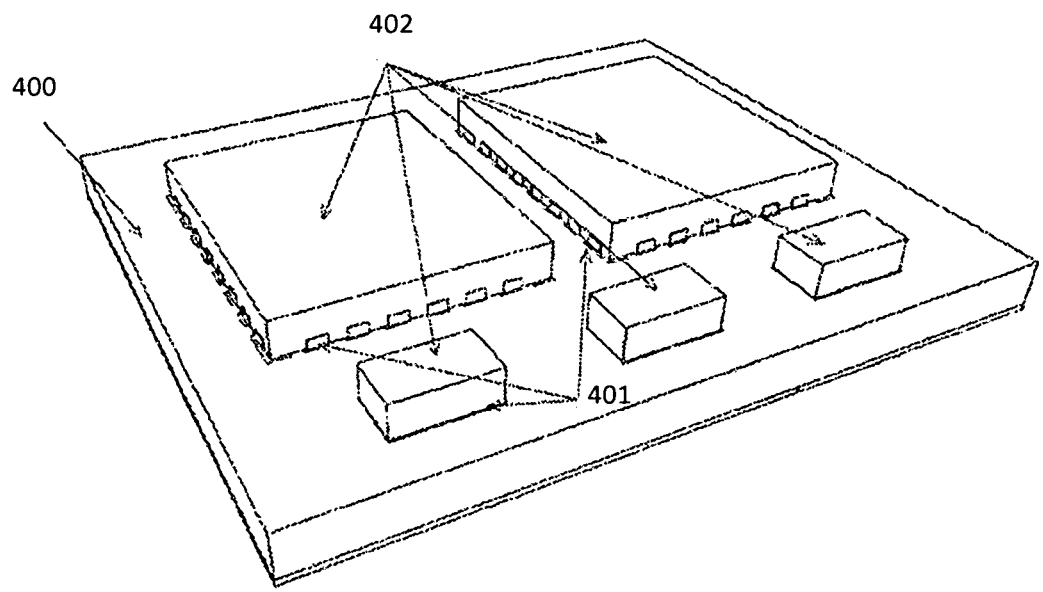
FIG. 7 illustrates an external view of another example of a multiple components-on-package (mCoP) device that may have multiple active and/or passive components attached to the top of a module package.

FIG. 7 illustrates an external view of another example of a multiple components-on-package (mCoP) device 400 that may have multiple active and/or passive components 402 attached to the top of a module package 400. The mCoP Module package 400 may be a fully molded electrical circuit with internal leadframes that form exposed pads 401 for electrical and/or thermal connections to one or more externally attached components 402.

Figure 8:
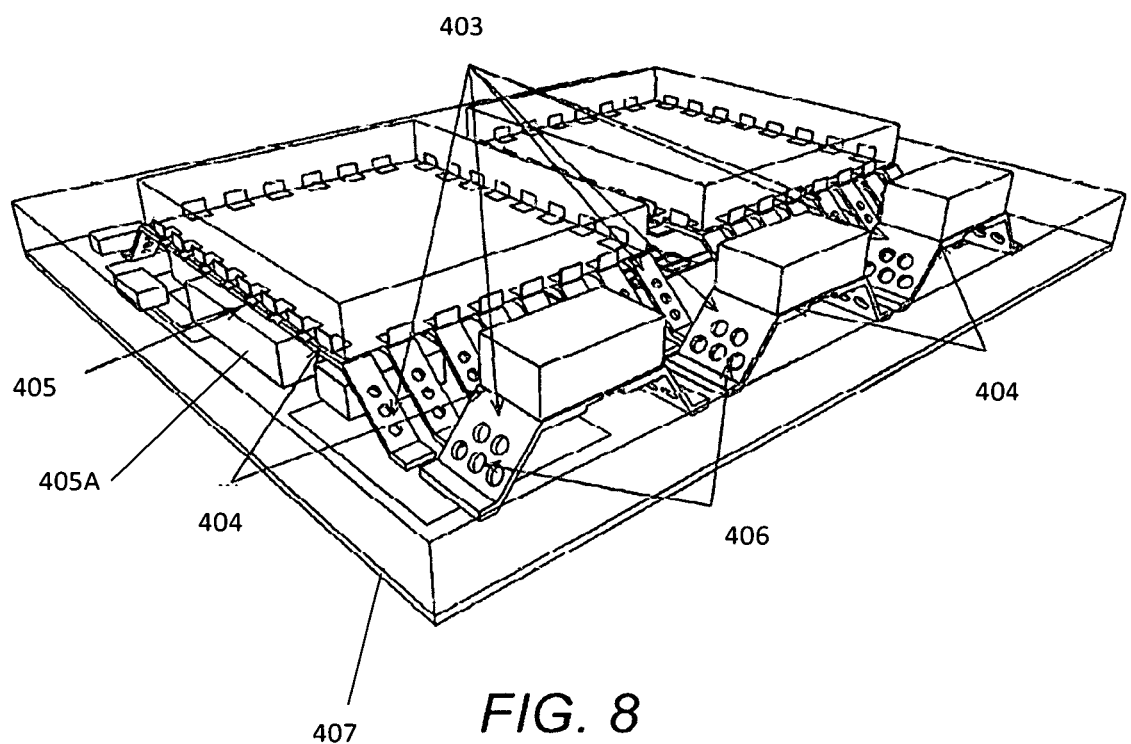
FIG. 8 illustrates internal construction details of another example of an mCoP module package that may have internal leadframes forming electrical and/or thermal pathways for externally attached component connections.

FIG. 8 illustrates internal construction details of another example of an mCoP module package that may have internal leadframes 403 forming electrical and/or thermal pathways for externally attached component connections 404. The example may be the same as the example shown in FIG. 7. Mechanically compliant through-mold leadframes 406 may complete the electrical circuit from the substrate 407 up to the component and may provide additional thermal and/or electrical connections 405 for internal components 405A. One or more of the leadframes 406 may contain openings 406 that may each be circular, oval, rectangular or any other shape. These openings 406 may improve plastic mold compound flow during the molding process and/or mold compound interlocking.

FIGS. 7 and 8 show an example of an mCoP device with multiple active and/or passive components attached to the top surface of the module package.

This device may require more complex leadframe designs and/or post-mold processing and/or post-mold machining, but may provide all the same functional characteristics as previously disclosed herein.

Additional machining and/or etching of the leadframe can be performed once the leadframe is embedded within the mold compound in case further electrical isolation is required for proper circuit operation of the mCoP. This machining may include both additive and subtractive modification to the imbedded/attached leadframe by means of mechanical and electrical means. For example, a milling machine, laser machining, chemical etching, and/or sawing the leadframe may be used to obtain isolated and/or routed connections for externally mounted components.

The mechanically compliant internal leadframes that have been described may provide electrically and/or thermally conductive pathways that distribute between the internal components and circuit within the module and the attached external components. Angular bends may be at precise locations and may act to decouple and redistribute any downward force due to assembly and mold packing pressures that might otherwise damage the substrate and/or attached components. The openings in the leadframe may be circular, oval, rectangular, or any other shape and may facilitate mold locking, mold flow, and/or minimize mold voids and/or prevent large areas of delamination.

The leadframe may also have a multiplicity of areas along the length on each side containing thinned regions, typically half the thickness being removed by machining and/or etching. These half-etch features may be provided at specific locations to further reduce the chance of delamination during subsequent reflows and other reliability related concerns.

The components, steps, features, objects, benefits, and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, objects, benefits, and/or advantages. These also include embodiments in which the components and/or steps are arranged and/or ordered differently.

For example, internal leadframes could be used to redistribute electrical signals within the module package, effectively providing an additional signal layer between components. These internal leadframes would not necessarily require exposure to the top surface of the package. These leadframes could be considered to be intermediate conductive layers that could act to bridge electrical signals from components at one side of the package and extend over many internal components to make high current connections to other components at the other side of the package. Leadframes forming internal connections from the backside of flip chip silicon die to other internal components would be one example. Connecting vertical FET's together and to the substrate would be another. Another example would be a leadframe spanning the entire distance of the package length to provide electrical and thermal connections for any number of components.

Internal leadframes that are exposed and/or revealed for surface connection of components can also form connections to external heat sinking materials, such as a heatsink, thermal pipes, and/or other electrically and/or thermally conductive materials. Connections such as these may further enhance heat dissipation from within the package and potentially allow for operation at higher power densities and currents.

Variations of what have been described may include a variety of attach methods to the substrate, internal components, and/or external components. These methods may include but are not limited to epoxy, solder, and/or any adhesive that is either conductive or non-conductive to heat and/or electricity. Furthermore, the internal leadframe may include any multiple of leadframes and/or structures that may form conductive pathways for relevant operation of the package. Leadframe structures may connect/attach to interposers, clips, metallic stand-offs, and/or any variation of material structure capable of providing a conductive pathway for heat and/or electricity. Externally mounted/attached components may include but are not limited to passive components, active components, and/or any variation of thermally and/or electrically conductive material to include heat sinking devices, heat pipes, intercoolers, and/or externally attached Peltier and/or energy harvesting and control devices.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications that have been cited in this disclosure are incorporated herein by reference.

The phrase "means for" when used in a claim is intended to and should be interpreted to embrace the corresponding structures and materials that have been described and their equivalents. Similarly, the phrase "step for" when used in a claim is intended to and should be interpreted to embrace the corresponding acts that have been described and their equivalents. The absence of these phrases from a claim means that the claim is not intended to and should not be interpreted to be limited to these corresponding structures, materials, or acts, or to their equivalents.

The scope of protection is limited solely by the claims that now follow. That scope is intended and should be interpreted to be as broad as is consistent with the ordinary meaning of the language that is used in the claims when interpreted in light of this specification and the prosecution history that follows, except where specific meanings have been set forth, and to encompass all structural and functional equivalents.

Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element proceeded by an "a" or an "an" does not, without further constraints, preclude the existence of additional elements of the identical type.

None of the claims are intended to embrace subject matter that fails to satisfy the requirement of Sections 101, 102, or 103 of the Patent Act, nor should they be interpreted in such a way. Any unintended coverage of such subject matter is hereby disclaimed. Except as just stated in this paragraph, nothing that has been stated or illustrated is intended or should be interpreted to cause a dedication of any component, step, feature, object, benefit, advantage, or equivalent to the public, regardless of whether it is or is not recited in the claims.

The abstract is provided to help the reader quickly ascertain the nature of the technical disclosure. It is submitted with the understanding that it will not be used to interpret or limit the scope or meaning of the claims. In addition, various features in the foregoing detailed description are grouped together in various embodiments to streamline the disclosure. This method of disclosure should not be interpreted as requiring claimed embodiments to require more features than are expressly recited in each claim. Rather, as the following claims reflect, inventive subject matter lies in less than all features of a single disclosed embodiment. Thus, the following claims are hereby incorporated into the detailed description, with each claim standing on its own as separately claimed subject matter.

The invention claimed is:

1. A component-on-package circuit comprising:
a circuit module comprising:
   a pad for mounting an electrical component thereon;
   a substrate;
   an internal component; and
   a leadframe which couples the internal component to the pad both electrically and thermally, the leadframe comprising a first foot, a second foot, and a top surface disposed between the first foot and the second foot through at least one non-planar extension of the leadframe, the at least one non-planar extension of the leadframe providing a spring-like cushioning of force applied to the pad, the first foot and the second foot mounted over the substrate, the leadframe comprising a conductive material extending between the first foot and the second foot,
wherein:
   the leadframe is at least partially encapsulated in a molding material;
   the leadframe comprises one or more openings configured to enable a flow of the molding material therethrough during a molding process; and
   the top surface of the leadframe is exposed through the molding material, the top surface forming the pad.

2. The component-on-package circuit of claim 1, wherein the internal component is mounted over the substrate, and wherein at least one of the first foot and the second foot are mounted over the internal component.

3. The component-on-package circuit of claim 1, wherein at least one of the first foot or the second foot is directly mounted to the substrate.

4. The component-on-package circuit of claim 1 wherein the at least one non-planar extension of the leadframe comprises at least one step between the first foot and the top surface.

5. The component-on-package circuit of claim 4 wherein the at least one step is electrically connected to at least a portion of the internal component.

6. The component-on-package circuit of claim 5 further comprising a first angled surface between the first foot and the at least one step and a second angled surface between the at least one step and the top surface.

7. The component-on-package circuit of claim 6 further comprising at least one step between the second foot and the top surface.

8. The component-on-package circuit of claim 6, wherein a first step between the first foot and the top surface and a second step between the second foot and the top surface are at the same elevation relative to the top surface.

9. The component-on-package circuit of claim 1 wherein:
the circuit module comprises a second leadframe that couples the internal component to a second pad electrically and thermally; and
the second leadframe comprises a non-planar shape and comprises a third foot, a fourth foot, and a second top surface between the third foot and the fourth foot, the second top surface connecting to or forming the second pad.

10. The component-on-package circuit of claim 1, further comprising the electrical component, wherein the pad is coupled to the electrical component.

11. The component-on-package circuit of claim 1 wherein the at least one non-planar extension of the leadframe comprises one or more openings extending therethrough.

12. The component-on-package circuit of claim 11 wherein the molding material passes through the one or more openings of the at least one non-planar extension.

13. A device having a packaged circuit, the device comprising:
an electrical component; and
the packaged circuit comprising:
a substrate;
a first pad exposed through a molding material of the packaged circuit, the electrical component mounted to the first pad,
an internal component disposed within the packaged circuit and mounted over the substrate,
a first leadframe which couples the internal component to the first pad both electrically and thermally, the first leadframe comprising a top surface disposed between a first foot and a second foot through at least one non-planar extension of the first leadframe that provides spring-like cushioning of force applied to the first pad, the first leadframe comprising a conductive material extending between the first foot and the second foot, the first foot electrically connected to the internal component,
wherein the top surface forms the first pad,
a second pad exposed through the molding material of the packaged circuit, the electrical component mounted to the second pad, and
a second leadframe which is spaced apart from the first leadframe along the substrate and comprises another top surface forming the second pad, the another top surface disposed between a third foot and a fourth foot through at least one non-planar extension of the second leadframe;
wherein:
the at least one non-planar extension of the first leadframe comprises two or more openings extending therethrough, and
the two or more openings are configured to enable the molding material to pass through the at least one non-planar extension.

14. The device of claim 13, wherein the first leadframe further comprises:
at least one step between the first foot and the top surface, the at least one step coupled to the internal component.

15. A method of making a component-on-package circuit comprising:
attaching an electrical component to a circuit module, the circuit module having a substrate, an internal component and at least one leadframe which connects the internal component to the electrical component after the attachment both electrically and thermally, the leadframe having a high degree of both electrical and thermal conductivity and a non-planar shape, the leadframe comprising a first foot, a second foot, and a top surface between the first foot and the second foot, the first foot and the second foot mounted over the substrate, the leadframe comprising a conductive material extending between the first foot and the second foot; and
encapsulating the circuit module in a molding material to expose the top surface of the leadframe through the molding material, the top surface forming a pad on which the electrical component is attached;
wherein the leadframe comprises one or more openings configured to enable a flow of the molding material therethrough during a molding process.

16. The method of claim 15, wherein the first foot and the second foot are directly mounted to the substrate.

* * * * *

UNITED STATES PATENT AND TRADEMARK OFFICE
CERTIFICATE OF CORRECTION

| | | |
|---|---|---|
| PATENT NO. | : 11,272,618 B2 | |
| APPLICATION NO. | : 16/095276 | |
| DATED | : March 8, 2022 | |
| INVENTOR(S) | : Brazzle et al. | |

It is certified that error appears in the above-identified patent and that said Letters Patent is hereby corrected as shown below:

On the Title Page

Item (71), (Applicant) at Line 3, delete "*MA (US)*" and insert -- *(IE)* --.

In the Specification

In Column 1 at Line 14 (Approx.), delete "*11.*" and insert -- *11,* --.

In the Claims

In Column 10 at Line 13 (Approx.), In Claim 13, delete "*therethrough,*" and insert -- *therethrough;* --.

Signed and Sealed this
Thirty-first Day of May, 2022

Katherine Kelly Vidal
*Director of the United States Patent and Trademark Office*